(12) United States Patent
Flynn et al.

(10) Patent No.: US 8,184,757 B2
(45) Date of Patent: May 22, 2012

(54) PATTERN AGNOSTIC ON-DIE SCOPE

(75) Inventors: James P. Flynn, Beaverton, OR (US); Junqi Hua, Portland, OR (US); Robert B. Lefferts, Portland, OR (US); Richard H. Steeves, Portland, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 155 days.

(21) Appl. No.: 12/819,660

(22) Filed: Jun. 21, 2010

(65) Prior Publication Data

US 2011/0311009 A1    Dec. 22, 2011

(51) Int. Cl.
*H04L 7/00* (2006.01)

(52) U.S. Cl. ......... 375/355; 375/229; 375/354; 375/371

(58) Field of Classification Search .......... 375/229–236, 375/354, 355, 371
See application file for complete search history.

(56) References Cited

U.S. PATENT DOCUMENTS

| 7,424,380 | B2 | 9/2008 | Sonntag | |
| 2009/0252213 | A1* | 10/2009 | Zerbe et al. | 375/231 |

\* cited by examiner

*Primary Examiner* — Curtis Odom
(74) *Attorney, Agent, or Firm* — Park, Vaughan, Fleming & Dowler LLP; Laxman Sahasrabuddhe

(57) ABSTRACT

An on-die scope is described. The on-die scope can include one or more scope slicers, phase sweeping circuitry, voltage sweeping circuitry, and eye-diagram data collection circuitry. The clock and data recovery circuitry can receive an input signal, and output a recovered clock signal and a recovered bit-stream. The phase sweeping circuitry can receive the recovered clock signal, and output the scope clock signal by adding a phase offset to the recovered clock signal. A scope slicer can receive the voltage threshold, the scope clock signal, and the input signal, and output a scope bit-stream. The eye-diagram data collection circuitry can detect one or more bit-patterns in the recovered bit-stream, and modify values of one or more scope counters based solely or partly on the scope bit-stream and the recovered bit-stream.

23 Claims, 4 Drawing Sheets

COMMUNICATION SYSTEM 400

PATTERN AGNOSTIC ON-DIE SCOPE

TECHNICAL FIELD

The present disclosure generally relates to communication systems. More specifically, the present disclosure relates to a pattern agnostic on-die scope.

BACKGROUND

Related Art

Oscilloscopes (or scopes) are widely used to debug problems in communication channels. External scopes can be expensive, and can alter the signal being measured because of the perturbation that occurs when a signal path is probed. This perturbation can make it difficult to diagnose problems in a communication channel.

On-die scopes can address this challenge, thereby allowing accurate measurements of signals (including any distortion associated with the receiver package). To reduce chip area, some on-die scopes use a slicer to collect data for an eye-diagram, which is a two-dimensional plot of voltage as a function of time that includes information about timing and voltage margins. The voltage threshold and the clock phase of the slicer usually need to be swept over a range of values in order to measure an eye-diagram.

Some high-speed communications systems use reference clocks which are asynchronous. For example, some high-speed communication standards use spread-spectrum clocks to reduce interference caused by electromagnetic radiation. Unfortunately, conventional on-die scopes are not suited for use with asynchronous clocks (e.g., spread-spectrum clocks).

SUMMARY

Some embodiments of the present invention provide a pattern agnostic on-die scope capable of creating an eye-diagram in an asynchronous communication system. Clock and data recovery (CDR) circuitry can receive a first input signal, and output a recovered clock signal and a recovered bit-stream. The on-die scope can include one or more scope slicers, phase sweeping circuitry, voltage sweeping circuitry, and eye-diagram data collection circuitry. A scope slicer can receive a voltage threshold, a scope clock signal, and a second input signal associated with the first input signal, and output a scope bit-stream. The phase sweeping circuitry can receive the recovered clock signal, and output the scope clock signal by adding a phase offset to the recovered clock signal. The voltage sweeping circuitry can vary the voltage threshold supplied to the scope slicers. The eye-diagram data collection circuitry can detect one or more bit-patterns in the recovered bit-stream, and modify values of one or more scope counters based solely or partly on the scope bit-stream and the recovered bit-stream.

In some embodiments, the CDR circuitry and the phase sweeping circuitry can receive a clock kill signal, which is used to temporally align the recovered clock signal and the scope clock signal.

In some embodiments, the on-die scope can include delay circuitry (e.g., an elastic store), which receives the scope bit-stream, and which outputs a delayed bit-stream so that the delayed bit-stream is substantially temporally aligned with the recovered bit-stream.

In some embodiments, the one or more scope counters include one or more bit-pattern counters and one or more scope-sample counters. The eye-diagram data collection circuitry can increment a bit-pattern counter when a bit-pattern associated with the bit-pattern counter is detected in the recovered bit-stream. Further, the eye-diagram data collection circuitry can increment a scope-sample counter when a bit-pattern associated with the scope-sample counter is detected in the recovered bit-stream and a bit in the scope bit-stream associated with the bit-pattern is equal to a predetermined value.

In some embodiments, the phase sweeping circuitry can include a phase rotator, a frequency divider, and a phase offset controller. The phase rotator can receive the recovered clock signal, and output a divider input signal that has a phase offset with respect to the recovered clock signal. The frequency divider can receive the divider input signal, and output the scope clock signal whose frequency is a fraction of the divider input signal's frequency. The phase offset controller can sweep the phase offset through a range of values.

In some embodiments, the voltage sweeping circuitry can include a voltage threshold controller which sweeps the voltage threshold through a range of values.

Once sufficient eye-diagram data has been collected, an eye-diagram can be determined. Specifically, the system can use the counter values to create a cumulative distribution function, and then differentiate the cumulative distribution function to obtain a probability distribution function. The probability distribution function, when plotted, can represent the eye-diagram.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Conventional on-die scopes create eye-diagrams in synchronous systems with a periodic data pattern. If the data is periodic (e.g., a repeating pattern of 127 bits), then samples taken one period apart (e.g., every $127^{th}$ bit in a repeating pattern of 127 bits) correspond to the same bit value. In conventional on-die scopes, after the CDR locks, the CDR functionality can be turned off, and the data slicers can be swept in both the time dimension and the amplitude dimension to create an eye-diagram.

Conventional approaches have at least three drawbacks. First, these approaches require knowledge of at least the period of the data pattern to reduce the noise in the raw data that is used to determine the eye-diagram. Second, conventional approaches do not work with live data, i.e., when the eye-diagram is created using a conventional on-die scope, the receiver stops receiving actual data. Third, conventional approaches only work with synchronous systems because the CDR functionality is turned off during eye-diagram creation. Unfortunately, if the system is asynchronous (e.g., if the transmitter is using a spread-spectrum clock), the scope output will be garbled if the CDR is turned off.

Figure 1:
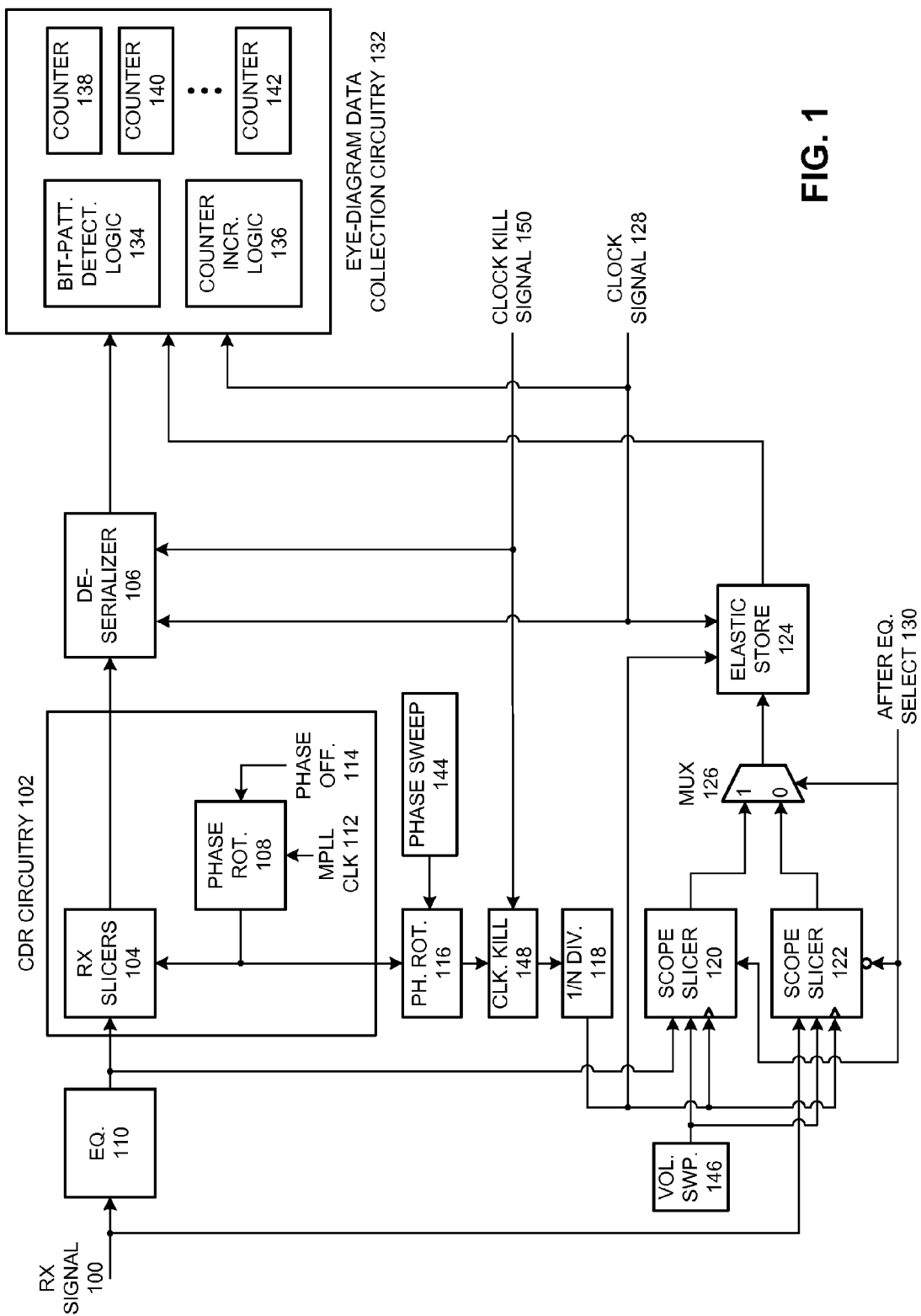
FIG. 1 illustrates a portion of an on-die scope in accordance with some embodiments of the present invention.

FIG. 1 illustrates a portion of an on-die scope in accordance with some embodiments of the present invention.

Received signal 100 can be supplied to equalizer 110 to perform equalization. The output of equalizer 110 can be supplied to CDR circuitry 102 to recover the clock and data embedded in received signal 100. In some embodiments, received signal 100 can be directly supplied to CDR circuitry 102. CDR circuitry 102 can include receiver slicers 104 and phase rotator 108. Phase rotator 108 can receive clock signal 112 from a multiplying phase locked loop (MPLL). Phase rotator 108 can also receive phase offset 114.

Once CDR circuitry 102 locks onto received signal 100 (or the output of equalizer 110), the output of phase rotator 108 causes receiver slicers 104 to sample received signal 100 (or the output of equalizer 110) at substantially the middle of the data eye. The output of phase rotator 108 (which is supplied as an input to receiver slicers 104) is the recovered clock signal. Receiver slicers 104 output the recovered data in the form of a bit-stream which can be de-serialized using de-serializer 106. In this disclosure, the term "bit-stream" generally refers to a time series of bits which may or may not be de-serialized into a series of data words. Specifically, the term "bit-stream," as used in this disclosure, can refer to a series of data words which was generated by de-serializing a time series of bits. Further details of CDR circuitry can be obtained from a number of references, such as, "A Digital Clock and Data Recovery Architecture for Multi-Gigabit/s Binary Links," by Jeff L. Sonntag and John Stonick, *IEEE Journal of Solid-State Circuits*, vol. 41, no. 8, Aug. 2006, pp. 1867-75, which is incorporated herein by reference.

De-serializer 106 receives clock signal 128 and clock kill signal 150. Clock kill signal 150 can be used to gate clock signal 128 in de-serializer 106. Specifically, when clock kill signal 150 is asserted, de-serializer 106 does not receive clock signal 128, which causes de-serializer 106 to stop. When clock kill signal 150 is reset, de-serializer 106 receives clock signal 128, and operates normally.

The on-die scope illustrated in FIG. 1 can include one or more scope slicers. Specifically, scope slicer 120 can be coupled with the output of equalizer 110, and scope slicer 122 can be coupled with the input of equalizer 110. The outputs of scope slicers 120 and 122 can be used for comparing the eye-diagrams before and after equalization.

Scope slicers 120 and 122 can receive a voltage threshold from voltage sweeping circuitry 146, which is capable of varying the voltage threshold.

Specifically, voltage sweeping circuitry 146 can sweep the voltage threshold through a range of voltage threshold values.

Phase sweeping circuitry can supply a scope clock signal to scope slicers 120 and 122. The phase sweeping circuitry can receive the recovered clock signal, vary the recovered clock's phase, and output the resulting clock signal as the scope clock signal. In other words, the phase sweeping circuitry is capable of varying a phase difference between the recovered clock signal and the scope clock signal. Specifically, the phase sweeping circuitry can include phase sweep controller 144, phase rotator 116, clock kill circuitry 148, and 1/N divider 118. The recovered clock signal can be provided as input to phase rotator 116, and the output of 1/N divider 118 can be supplied as a scope clock signal to scope slicers 120 and 122. Clock kill circuitry 148 can be used to gate the output of phase rotator 116 based on clock kill signal 150. Specifically, when clock kill signal 150 is asserted, the output of clock kill circuitry 148 is not a clock signal (e.g., the output can be a constant voltage). On the other hand, when clock kill signal 150 is reset, the output of clock kill circuitry 148 can be the same as the output of phase rotator 116, which is a clock signal. Clock kill signal 150 can be used to facilitate temporal alignment between the recovered clock signal and the scope clock signal.

In some embodiments, at any given time, the on-die scope collects eye-diagram data for either the received signal 100 or the equalized signal (i.e., the output of equalizer 110), but not both. In these embodiments, scope slicers 120 and 122 can receive an enable signal which, when asserted, causes scope slicers 120 and 122 to operate. The outputs of scope slicers 120 and 122 can be coupled with the inputs of multiplexer 126, and the enable signal can be supplied as the control input to multiplexer 126. When the enable signal (shown as signal "after equalization select 130" in FIG. 1) is asserted, the output of multiplexer 126 corresponds to the output of scope slicer 120, which, in turn, causes the on-die scope to collect eye-diagram data for the equalized signal (i.e., the output of equalizer 110). On the other hand, when the enable signal is reset, the output of multiplexer 126 corresponds to the output of scope slicer 120, which, in turn, causes the on-die scope to collect eye-diagram data for received signal 100.

The output of multiplexer 126 can be provided as input to elastic store 124, which operates using the scope clock signal (output of 1/N divider 118) and clock signal 128. Elastic store 124 can include a circular buffer such that data can be written into and read from the circular buffer using clock signals that are not synchronized with each other. Specifically, data can be written into elastic store 124's circular buffer by using the scope clock signal, and data can be read from elastic store 124's circular buffer by using clock signal 128. Elastic store 124 can also provide programmable delay functionality. Specifically, the delay introduced by elastic store 124 can be adjusted by changing the locations of the read and write pointers in the circular buffer. In some embodiments, elastic store 124 is used as delay circuitry to delay the scope bit-stream so that the delayed bit-stream is substantially temporally aligned with the recovered bit-stream.

The scope bit-stream (e.g., the output from elastic store 124) and the recovered bit-stream (e.g., the output from de-serializer 106) can be supplied to eye-diagram data collection circuitry 132. Note that each bit in the scope bit-stream can be associated with a bit in the recovered bit-stream.

Eye-diagram data collection circuitry 132 can include bit-pattern detection logic 134, counter incrementing logic 136, and one or more counters, such as counters 138-142. Specifically, eye-diagram data collection circuitry 132 can include one or more bit-pattern counters and one or more scope-sample counters.

A bit-pattern counter and a scope-sample counter can be associated with each bit-pattern of interest. For example, a bit-pattern counter and a scope-sample counter can be associated with each of the eight possible three-bit bit-patterns, namely, bit-patterns 000, 001, 010, 011, 100, 101, 110, and 111. Longer or shorter bit-patterns may also be used.

Bit-pattern detection logic 134 can be configured to detect one or more bit-patterns in the recovered bit-stream. When a bit-pattern is detected by bit-pattern detection logic 134, counter incrementing logic 136 can increment the value stored in the associated bit-pattern counter. The middle bit in the detected bit-pattern may be associated with the scope sample bit. If the value of this scope sample bit has a particular value (e.g., if the scope sample bit is 1), counter incrementing logic 136 can increment the value stored in the scope-sample counter associated with the bit-pattern.

The size of the bit-pattern and the association of the scope sample bit with the bit in the bit-pattern can be varied. A longer bit-pattern can improve the quality of the eye-diagram, but may increase the amount of circuitry required and the time to collect data for generating the eye-diagram.

Figure 2:
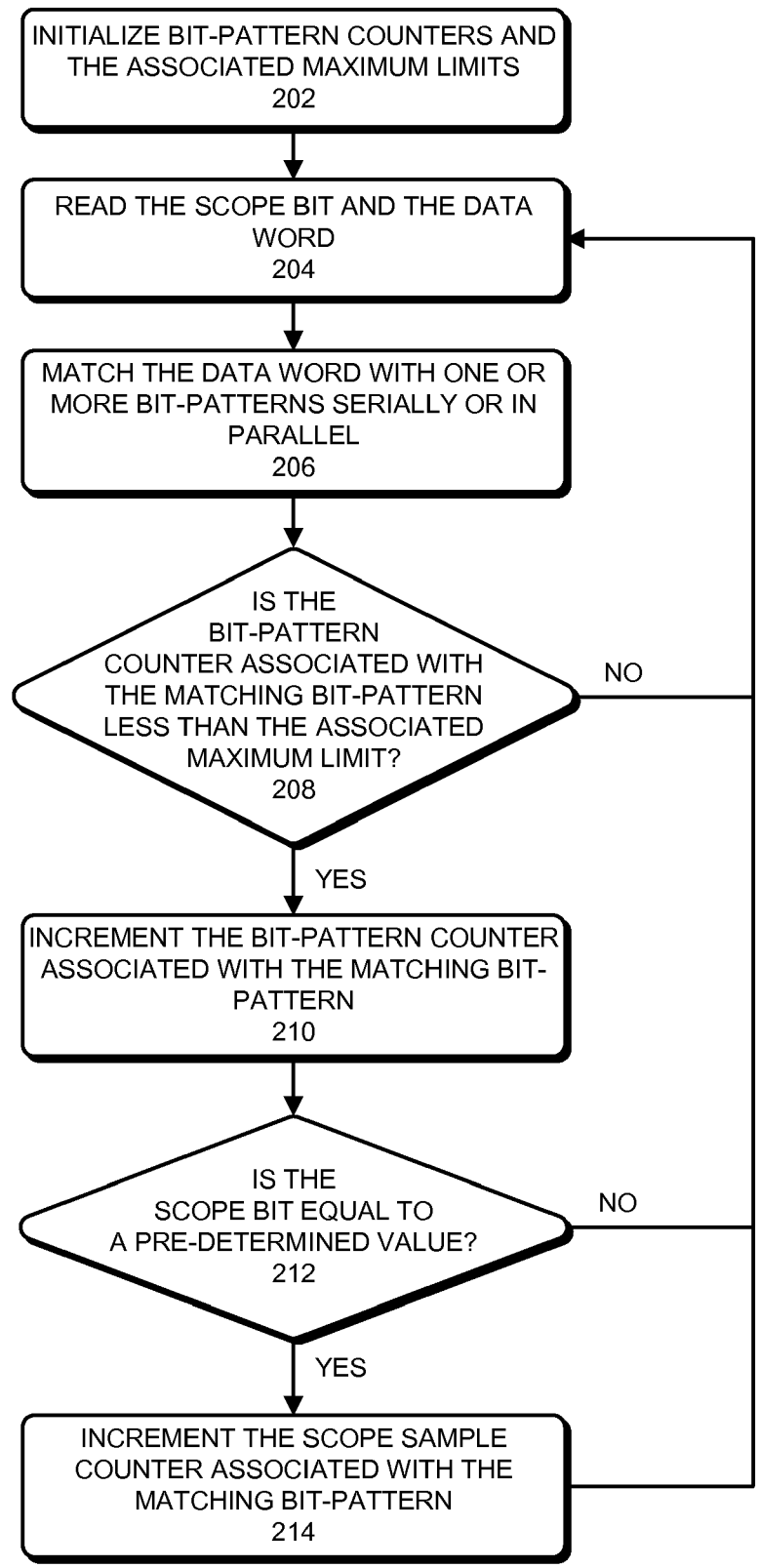
FIG. 2 illustrates a process for incrementing bit-pattern counters and scope-sample counters in accordance with some embodiments of the present invention.

FIG. 2 illustrates a process for incrementing bit-pattern counters and scope-sample counters in accordance with some embodiments of the present invention.

The process can begin by initializing bit-pattern counters and the associated maximum limits (step 202). Each bit-pattern counter can have a maximum limit associated with it. The system can use the maximum limits to determine when sufficient data has been collected for creating the eye-diagram. In some embodiments, each bit-pattern counter is initialized to zero, and each maximum limit is set to the same value. In some embodiments, the system uses the recovered bit-stream to determine relative frequencies of each bit-pattern, and sets the maximum limit according to the relative frequencies. A benefit of setting the maximum limits according to the relative frequencies is that the resulting eye-diagram appears similar to an eye-diagram that would have been created by an analog oscilloscope. Another benefit is that the system will not wait for a bit-pattern to occur if it is known a priori that the bit-pattern does not occur in the input signal.

Next, the system can read the scope bit and the data word (step 204). The data word can comprise a group of bits that include the bit in the recovered bit-stream which is associated with the scope bit. For example, if a three-bit data word is used, the middle data bit in the three-bit data word can correspond to the scope bit.

The system can then match the data word with one or more bit-patterns serially or in parallel (step 206). In a serial approach, the system can try to match the first bit-pattern with the data word, and if the pattern does not match, the system can try to match the second bit-pattern with the data word, and so forth. In some embodiments, the system can match only one bit-pattern at a time. Specifically, the system can first collect eye-diagram data for the first bit-pattern, then collect eye-diagram data for the second bit-pattern, and so forth. In a parallel approach, the system can try to match the data word with two or more bit-patterns simultaneously.

Once a matching data pattern is found, the system can determine whether the bit-pattern counter associated with the matching bit-pattern is less than the associated maximum limit (step 208). If the bit-pattern counter has reached the associated maximum limit, the system can return to step 204 to process the next scope bit.

On the other hand, if the bit-pattern counter has not reached the associated maximum limit, the system can increment the bit-pattern counter associated with the matching bit-pattern (step 210).

Next, the system can determine whether the scope bit is equal to a pre-determined value (step 212). The scope-sample counters are used for counting the number of 0s or 1s outputted by the scope slicer. If a scope-sample counter is used for counting the number of 0s, the pre-determined value is 0. On the other hand, if a scope-sample counter is used for counting the number of 1s, the pre-determined value is 1. If the scope bit is not equal to the pre-determined value, the system can return to step 204 to process the next scope bit.

On the other hand, if the scope bit is equal to the pre-determined value, the system can increment the scope-sample counter associated with the matching bit-pattern (step 214). Next, the system can return to step 204 to process the next scope bit. The process can be terminated once a sufficient amount of data has been collected for each bit-pattern, e.g., when the maximum limit has been reach for each bit-pattern.

The process illustrated in FIG. 2 can be described in a hardware description language (HDL), which can then be used to synthesize a register transfer logic (RTL) circuit which, when activated, performs the process.

The process in FIG. 2 is for illustration purposes only and is not intended to limit the scope of the present invention. Many variations and modifications will be apparent to one skilled in the art. For example, the system can count the number of times a bit-pattern appeared in the recovered bit-stream by decrementing a counter instead of incrementing the counter.

Figure 3:
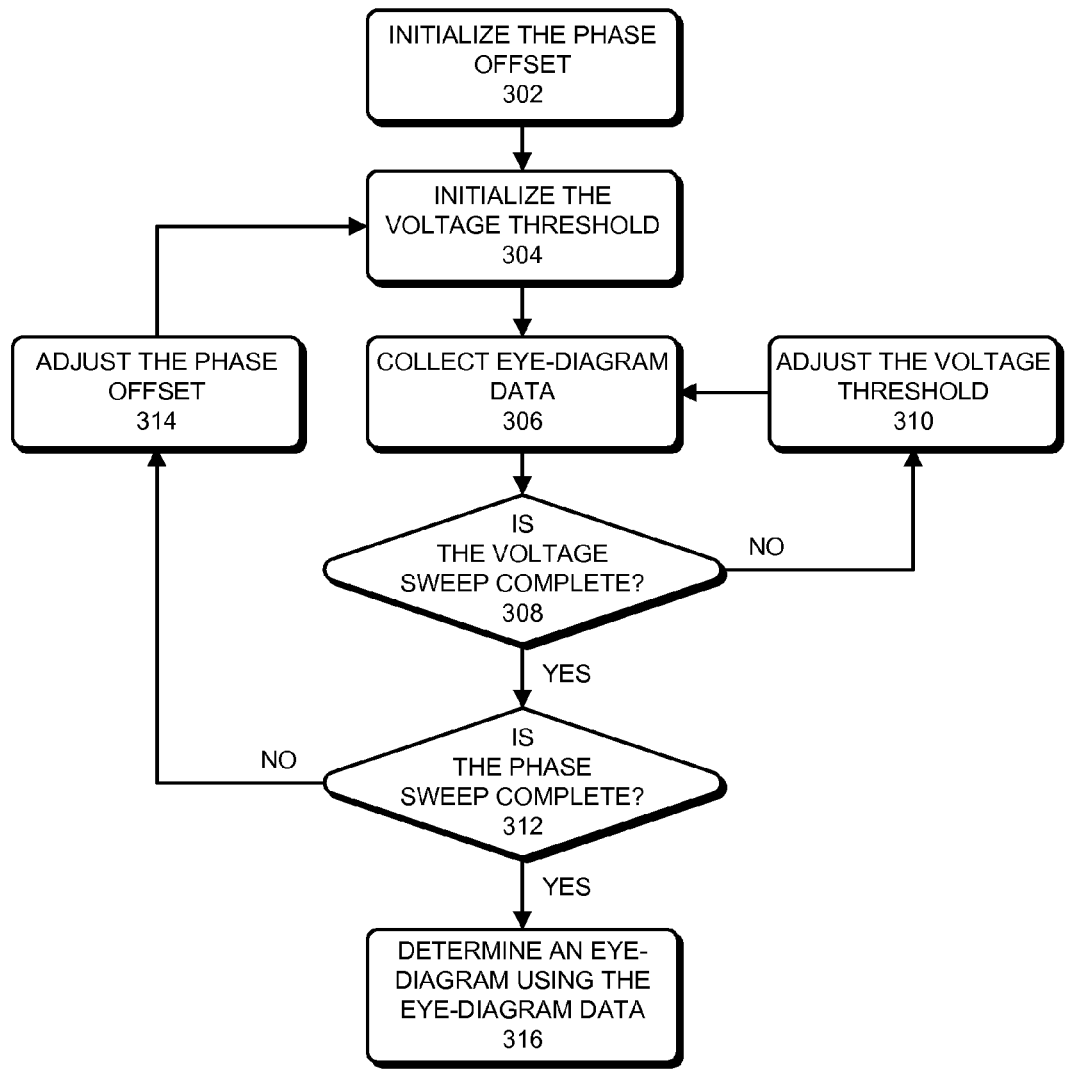
FIG. 3 illustrates a process for determining an eye-diagram in accordance with some embodiments of the present invention.

FIG. 3 illustrates a process for determining an eye-diagram in accordance with some embodiments of the present invention.

The process can begin by initializing the phase offset (step 302). Next, the system can initialize the voltage threshold (step 304). The system can then collect eye-diagram data (step 306). For example, the system can use the process illustrated in FIG. 2 to collect eye-diagram data.

The system can then determine whether the voltage sweep is complete (step 308). If the voltage sweep is not complete, the system can adjust the voltage threshold (step 310), and return to step 306 to collect eye-diagram data for the new voltage threshold value.

On the other hand, if the voltage sweep is complete, the system can determine if the phase sweep is complete (step 312). If the phase sweep is not complete, the system can adjust the phase offset (step 314), and return to step 304 to initialize the voltage threshold.

On the other hand, if the phase sweep is complete, the system can determine an eye-diagram using the eye-diagram data (step 316). Specifically, the system can use the counter values to create a cumulative distribution function, and then differentiate the cumulative distribution function to obtain a probability distribution function. The probability distribution function, when plotted, can represent the eye-diagram.

Specifically, for each phase offset and voltage threshold, the system can divide the sum of the scope-sample counters by the sum of the bit-pattern counters to obtain the cumulative distribution function value associated with the phase offset and the voltage threshold. Next, the system can differentiate the cumulative distribution function along the voltage dimension to obtain a probability distribution function for each phase offset value. The eye-diagram can then be obtained by plotting the probability density function along the vertical axis for each phase offset value on the horizontal axis.

To understand why the probability density function corresponds to the eye-diagram, let us assume, without loss of generality, that a low voltage corresponds to a 0 and a high voltage corresponds to a 1. When the scope slicer's threshold is below the eye, the scope slicer almost always outputs a 1. As the threshold moves through the lower edge of the eye, the scope slicer outputs an increasing number of 0s until the scope slicer starts outputting almost an equal number of 1s and 0s. As the threshold moves through the eye opening, the scope slicer continues to output approximately an equal number of 1s and 0s. Then, when the threshold moves through the upper edge of the eye, the scope slicer begins to output more 0s than 1s. Finally, once the threshold is above the eye, the scope slicer almost always outputs 0. Further details on computing the eye-diagram can be found in U.S. Pat. No. 7,424,380, entitled "Method and Apparatus for Integrated Distribution Function Capture," by Jeffrey L. Sonntag, John T. Stonick, and Daniel K. Weinlader, filed on 30 Nov. 2005, and issued on 9 Sep. 2008, which is incorporated herein by reference.

The process in FIG. 3 is for illustration purposes only and is not intended to limit the scope of the present invention. Many variations and modifications will be apparent to one skilled in the art. For example, the system can switch the voltage sweep loop and the phase sweep loop, i.e., the system can sweep through all phase offsets between two voltage threshold adjustments.

Figure 4:
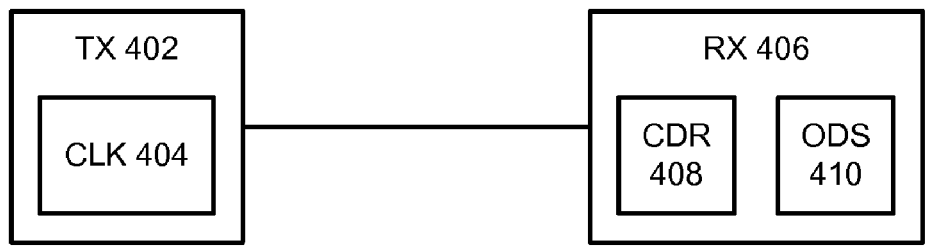
FIG. 4 illustrates a communication system in accordance with some embodiments of the present invention.

FIG. 4 illustrates a communication system in accordance with some embodiments of the present invention.

Communication system 400 includes transmitter 402 which transmits data using clock 404, which can be a spread-spectrum clock. Transmitter 402 is coupled with receiver 406 which includes CDR circuitry 408 and on-die scope circuitry 410. For example, on-die scope circuitry can use the circuit configuration illustrated in FIG. 1. Note that receiver 406 can use a clock that is asynchronous with respect to clock 404. CDR circuitry 408 enables receiver 406 to continuously track clock 404 even if they are asynchronous with respect to each other. The recovered clock from CDR circuitry 408 is used by on-die scope 410 to collect eye-diagram data. Note that if on-die scope 410 did not use the recovered clock signal from CDR circuitry 408, it would not have been able to collect reliable eye-diagram data in the presence of an asynchronous clock (e.g., a spread-spectrum clock).

Figure 5:
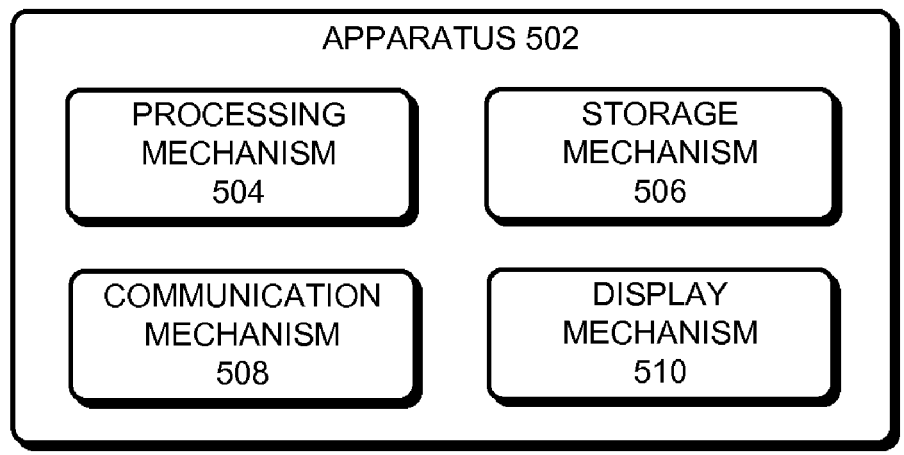
FIG. 5 illustrates an apparatus in accordance with some embodiments of the present invention.

FIG. 5 illustrates an apparatus in accordance with some embodiments of the present invention.

Apparatus 502 can comprise a plurality of mechanisms which may communicate with one another via a wired or wireless communication channel. Apparatus 502 may be realized using one or more integrated circuits, and apparatus 502 may include fewer or more mechanisms than those shown in FIG. 5. Further, apparatus 502 may be integrated in a computer system, or it may be realized as a separate device which is capable of communicating with other computer systems and/or devices. Specifically, apparatus 502 can include processing mechanism 504, storage mechanism 506, communication mechanism 508, and display mechanism 510.

Processing mechanism 504 can generally be any mechanism that can perform computations. Specifically, processing mechanism 504 can be a microprocessor which may include multiple processing cores, a network processor, a digital-signal-processor, a processor used in a portable computing and/or communication device (e.g., a smart phone), or any other processing mechanism now known or later developed.

Storage mechanism 506 can include any non-transitory computer-readable storage media or device. Specifically, storage mechanism 506 can include volatile memory, non-volatile memory, magnetic and optical storage devices such as disk drives, magnetic tape, CDs (compact discs), DVDs (digital versatile discs or digital video discs), or other media or device, now known or later developed, that is capable of storing code and/or data.

Communication mechanism 508 can generally include any mechanism that enables apparatus 502 to communicate with other devices, apparatuses, and/or computers. Communication mechanism 508 can include one or more receivers and one or more transmitters. In some embodiments, communication mechanism 508 includes a high-speed serial interface.

The receivers in communication mechanism 508 can include on-die scope circuitry for collecting eye-diagram data. Processing mechanism 504 and communication mechanism 508 may be capable of accessing data stored in storage mechanism 506. For example, communication mechanism 508 may collect eye-diagram data and store the data in storage mechanism 506. Next, processing mechanism 504 may manipulate the data stored in storage mechanism 506 to create an eye-diagram, and display mechanism 510 may display the eye-diagram to a user.

Conclusion

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit, comprising:
  clock and data recovery (CDR) circuitry, which receives a first input signal, and which outputs a recovered clock signal and a recovered bit-stream;
  a scope slicer, which receives a voltage threshold, a scope clock signal, and a second input signal associated with the first input signal, and which outputs a scope bit-stream;
  phase sweeping circuitry, which receives the recovered clock signal, and which outputs the scope clock signal, wherein the phase sweeping circuitry is capable of varying a phase difference between the recovered clock signal and the scope clock signal;

voltage sweeping circuitry which is capable of varying the voltage threshold; and eye-diagram data collection circuitry, which is capable of detecting one or more bit-patterns in the recovered bit-stream, and which is capable of modifying values of one or more scope counters based solely or partly on the scope bit-stream and the recovered bit-stream.

2. The circuit of claim 1, wherein the CDR circuitry and the phase sweeping circuitry receive a clock kill signal, which is used to temporally align the recovered clock signal and the scope clock signal.

3. The circuit of claim 1, comprising delay circuitry, which receives the scope bit-stream, and which outputs a delayed bit-stream so that the delayed bit-stream is substantially temporally aligned with the recovered bit-stream.

4. The circuit of claim 1, wherein the one or more scope counters include:
one or more bit-pattern counters; and
one or more scope-sample counters.

5. The circuit of claim 4, wherein the eye-diagram data collection circuitry increments a bit-pattern counter when a bit-pattern associated with the bit-pattern counter is detected in the recovered bit-stream.

6. The circuit of claim 4, wherein the eye-diagram data collection circuitry increments a scope-sample counter when a bit-pattern associated with the scope-sample counter is detected in the recovered bit-stream and a bit in the scope bit-stream associated with the bit-pattern is equal to a pre-determined value.

7. The circuit of claim 1, wherein the phase sweeping circuitry includes:
a phase rotator, which receives the recovered clock signal, and which outputs a divider input signal that has a phase offset with respect to the recovered clock signal; and
a frequency divider, which receives the divider input signal, and which outputs the scope clock signal whose frequency is a fraction of the divider input signal's frequency.

8. The circuit of claim 7, wherein the phase sweeping circuitry includes a phase offset controller which sweeps the phase offset through a range of values.

9. The circuit of claim 1, comprising a voltage threshold controller which sweeps the voltage threshold through a range of values.

10. The circuit of claim 1, wherein the first input signal and the second input signal are the same.

11. The circuit of claim 1, wherein the first input signal is obtained by performing equalization on the second input signal.

12. A communication system, comprising:
a transmitter which transmits a signal using a first reference clock; and
a receiver coupled to the transmitter, wherein the receiver uses a second reference clock that is asynchronous with respect to the first reference clock, and wherein the receiver comprises:
equalization circuitry, which receives the signal, and outputs an equalized signal;
clock and data recovery (CDR) circuitry, which receives the equalized signal, and which outputs a recovered clock signal and a recovered bit-stream;
a scope slicer, which receives a voltage threshold, a scope clock signal, and the equalized signal, and which outputs a scope bit-stream;
phase sweeping circuitry, which receives the recovered clock signal, and which outputs the scope clock signal, wherein the phase sweeping circuitry is capable of varying a phase difference between the recovered clock signal and the scope clock signal;
voltage sweeping circuitry which is capable of varying the voltage threshold; and
eye-diagram data collection circuitry, which is capable of detecting one or more bit-patterns in the recovered bit-stream, and which is capable of modifying values of one or more scope counters based solely or partly on the scope bit-stream and the recovered bit-stream.

13. The communication system of claim 12, wherein the CDR circuitry and the phase sweeping circuitry receive a clock kill signal, which is used to temporally align the recovered clock signal and the scope clock signal.

14. The communication system of claim 12, comprising delay circuitry, which receives the scope bit-stream, and which outputs a delayed bit-stream so that the delayed bit-stream is substantially temporally aligned with the recovered bit-stream.

15. The communication system of claim 12, wherein the one or more scope counters include:
one or more bit-pattern counters; and
one or more scope-sample counters.

16. The communication system of claim 15, wherein the eye-diagram data collection circuitry increments a bit-pattern counter when a bit-pattern associated with the bit-pattern counter is detected in the recovered bit-stream.

17. The communication system of claim 15, wherein the eye-diagram data collection circuitry increments a scope-sample counter when a bit-pattern associated with the scope-sample counter is detected in the recovered bit-stream and a bit in the scope bit-stream associated with the bit-pattern is equal to a pre-determined value.

18. An apparatus, comprising:
a communication mechanism, wherein the communication mechanism includes:
clock and data recovery (CDR) circuitry, which receives a first input signal, and which outputs a recovered clock signal and a recovered bit-stream;
a scope slicer, which receives a voltage threshold, a scope clock signal, and a second input signal associated with the first input signal, and which outputs a scope bit-stream;
phase sweeping circuitry, which receives the recovered clock signal, and which outputs the scope clock signal, wherein the phase sweeping circuitry is capable of varying a phase difference between the recovered clock signal and the scope clock signal;
voltage sweeping circuitry which is capable of varying the voltage threshold; and
eye-diagram data collection circuitry, which is capable of detecting one or more bit-patterns in the recovered bit-stream, and which is capable of modifying values of one or more scope counters based solely or partly on the scope bit-stream and the recovered bit-stream;
a storage mechanism configured to store values of the one or more scope counters for a range of voltage threshold and phase values;
a processing mechanism, which determines an eye-diagram using the values of the one or more scope counters stored in the storage mechanism; and
a display mechanism configured to display the eye-diagram.

19. The apparatus of claim 18, wherein the CDR circuitry and the phase sweeping circuitry receive a clock kill signal, which is used to temporally align the recovered clock signal and the scope clock signal.

20. The apparatus of claim 18, comprising delay circuitry, which receives the scope bit-stream, and which outputs a delayed bit-stream so that the delayed bit-stream is substantially temporally aligned with the recovered bit-stream.

21. The apparatus of claim 18, wherein the one or more scope counters include:
   one or more bit-pattern counters; and
   one or more scope-sample counters.

22. The apparatus of claim 18, wherein the eye-diagram data collection circuitry increments a bit-pattern counter when a bit-pattern associated with the bit-pattern counter is detected in the recovered bit-stream.

23. The apparatus of claim 18, wherein the eye-diagram data collection circuitry increments a scope-sample counter when a bit-pattern associated with the scope-sample counter is detected in the recovered bit-stream and a bit in the scope bit-stream associated with the bit-pattern is equal to a predetermined value.

* * * * *